United States Patent [19]

Suda

[11] Patent Number: 4,629,514

[45] Date of Patent: Dec. 16, 1986

[54] METHOD OF PRODUCING II-V COMPOUND SEMICONDUCTORS

[75] Inventor: Toshikazu Suda, Yokohama, Japan

[73] Assignee: Shinanokenshi Co., Ltd., Nagano, Japan

[21] Appl. No.: 708,406

[22] Filed: Mar. 5, 1985

[30] Foreign Application Priority Data

Mar. 8, 1984 [JP] Japan ................................. 59-45307

[51] Int. Cl.$^4$ ........................................... H01L 21/38
[52] U.S. Cl. ..................................... 148/1.5; 148/171; 148/186; 148/189; 148/DIG. 18; 148/DIG. 125; 204/192.21; 204/192.25; 250/492.2; 136/260; 136/265; 427/85; 427/87
[58] Field of Search ................. 148/1.5, 171, 174, 177, 148/186, 189, DIG. 18, DIG. 23, DIG. 125; 204/192 S, 192 N; 427/85, 87; 136/260, 265; 250/492.2; 357/61, 63, 64, 91

[56] References Cited

PUBLICATIONS

F. C. Wang et al., *Journal of Crystal Growth*, vol. 55, pp. 268-272 (1981).
F. C. Wang et al., Conf. Record, 16th IEEE Photovoltaic Specialists Conf. (1982), published Jan. 1983, pp. 1047-1050.
T. L. Chu et al., *J. Appl. Phys.*, vol. 54, pp. 2063-2067 (1983).
S. G. Parker et al., *J. Phys. Chem. Solids*, vol. 32, pp. 139-147 (1971).
H. J. Hovel et al., *J. Electrochem. Soc.*, vol. 116, pp. 843-847 (1969).
P. M. R. Kay et al., *J. Crystal Growth*, vol. 31, pp. 339-344 (1975).
M. Hirose, Chapter 6 in *Semiconductors & Semimetals*, vol. 21A, pp. 109-122, Academic Press (1984).
W. Kern et al., Chapter III-2 in "Thin Film Processes", edited by J. L. Vossen et al., Academic Press (1978), pp. 257-265.
M. H. Brodsky, Editor, "Amorphous Semiconductors", Springer-Verlag (1979), pp. 191-201.
R. Nitsche et al., *J. Phys. Chem. Solids*, vol. 21, pp. 199-205 (1961).
R. Nitsche, *J. Phys. Chem. Solids*, vol. 17, pp. 163-165 (1960).
T. Suda et al., *Appl. Phys. Lett.*, vol. 45, pp. 775-777 (1984).

*Primary Examiner*—Aaron Weisstuch
*Attorney, Agent, or Firm*—Morgan & Finnegan

[57] ABSTRACT

A method of producing II-V compound semiconductors with greatly reduced intrinsic defect levels comprises the step of causing atoms or ions of at least one member selected from the group consisting of hydrogen and the halogens to be injected into and diffused through II-V compound semiconductors during or after the production thereof.

6 Claims, 7 Drawing Figures

METHOD OF PRODUCING II-V COMPOUND SEMICONDUCTORS

BACKGROUND OF THE INVENTION

1. Field of the Invention

This invention relates to a method of producing II-V compound semiconductors and more particularly to a method of producing II-V compound semiconductors with greatly reduced density of intrinsic defect levels suitable for use in such electronic devices as solar cells, sensors, lasers, transistors, and diodes.

2. Description of the Prior Art

The electronics industry, which got its start using semiconductors in Group IV of the Periodic Table (Ge, Si), later was able to practically apply II-VI compounds such as CdS, ZnS, ZnO, etc. and today has reached the stage of utilizing III-V compounds such as GaAs, GaP, and InP, etc.

Now II-V compounds have come to show strong promise of constituting the next generation of electronic materials. Among these, zinc phosphide ($Zn_3P_2$), the constituent elements of which are known to be present in abundant deposits near the surface of the earth, is drawing particularly strong attention as a material which it is hoped will make it possible to produce highly efficient solar cells, sensors, lasers and the like at low cost.

For the practical application of the II-V compound semiconductors, however, it is necessary to overcome the problems posed by the fact that they are defect semiconductors having several vacancies in their unit cells. Cadmium arsenide, for example, has a pseudo-fluorite structure wherein the cadmium atom at every fourth lattice site constitutes a vacancy, while in the case of zinc phosphide, 8 vacancies of zinc atoms are involved in the 40 atoms of each unit cell. As a result, these semiconductors include numerous deep defect levels attributed to the deficiency of atoms so that up to now it has been impossible to practically apply them to electronic devices because of their extremely low performance.

SUMMARY OF THE INVENTION

In view of the foregoing observations and description, the primary object of the invention is to provide a method of producing II-V compound semiconductors in which the defect level density attributed to the deficiency of atoms is greatly reduced so as to make them suitable for use in electronic devices.

The method of the present invention works on the principle of reducing the intrinsic defect level density of II-V compound semiconductors by incorporating into and diffusing through the II-V compound semiconductor hydrogen or a halogen (fluorine, chlorine, bromine, iodine etc.) so as to fill in the atom vacancies which are the cause of the intrinsic defect levels.

Although in the prior art there has been known a method of using hydrogen or a halogen to reduce the gap state density attributed to dangling bonds in an amorphous silicon, it should be noted that the present invention differs from this known technique in the type of semiconductor treated, the nature of the defect treated, and the principle by which the defect is eliminated.

The present invention provides a method of producing II-V compound semiconductors with greatly reduced intrinsic defect level density, comprising the step of causing atoms or ions of at least one member selected from the group consisting of hydrogen and the halogens to be injected into and diffused through thin films of II-V compound semiconductors while they are being produced by the low-pressure vapor-phase method (physical and chemical vapoer deposition), the normal-pressure vapor-phase method, the laser chemical vapor deposition (CVD), the photo-CVD,, metal organic chemical vapor deposition method, the radical beam method, the plasma CVD the glow discharge method, the sputtering method, the ion beam method, the ion deposition method, the ion plating method, the ionized cluster beam method, the molecular beam epitaxy method, the MOMBE (metal organic molecular beam epitaxy) method, electron cyclotoron resonance CVD, atomic layer epitaxy method, or the plasma-assisted epitaxy method, or, after the production thereof, where it is being subjected to an aftertreatment employing the plasma method, the ion beam method, the diffusion method, the ion implantation method or the ion plating method, ion deposition method, radical beam method, electron cyclotoron resonance method, etc.

DESCRIPTION OF THE PREFERRED EMBODIMENTS

The invention will now be explained in detail with reference to embodiments thereof.

FIRST Embodiment

Figure 1:
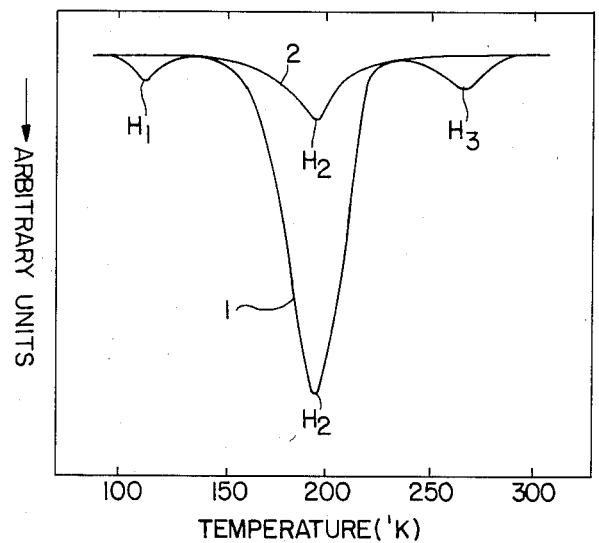
FIG. 1 and FIG. 2 are spectra of the defect level density in Schottky diodes made from zinc phosphide thin films produced in accordance with a first embodiment of this invention.

Hydrogen was added (incorporated and diffused) into a thin film of zinc phosphide during the course of its production by the low-pressure CVD. Another thin film was produced under identical conditions except that it was not hydrogenated. The so-obtained thin films of zinc phosphide were used to fabricate Schottky diodes. Two of these diodes, one hydrogenated and the other not, were taken as first samples and the defect level density was measured by deep level transient spectroscopy (DLTS) method at a rate window of 128/sec. The results obtained are shown in the graph of FIG. 1 wherein the x-axis represents temperature (°K.) and the y-axis represents defect level density (in arbitrary units). On curve 1 in this figure, the levels $H_1$, $H_2$, $H_3$ indicating high defect density in the non-hydrogenated sample are the three intrinsic hole trap levels in the p-type zinc phosphide. The level $H_1$ is located at 0.20 electron volt (eV), $H_2$ at 0.36 eV, and $H_3$ at 0.48 eV from the top of the valence band. The density at the level $H_1$ is $1.3 \times 10^{13}/cm^3$, that at the level $H_2$ is $1.1 \times 10^{14} cm^3$, and that at the level H is $1.1 \times 10^{13}/cm^3$. With hydrogenation (curve 2), the levels $H_1$ and $H_3$ disappeared completely and the density at level $H_2$ was reduced to about 1/10 of its former magnitude.

Figure 2:
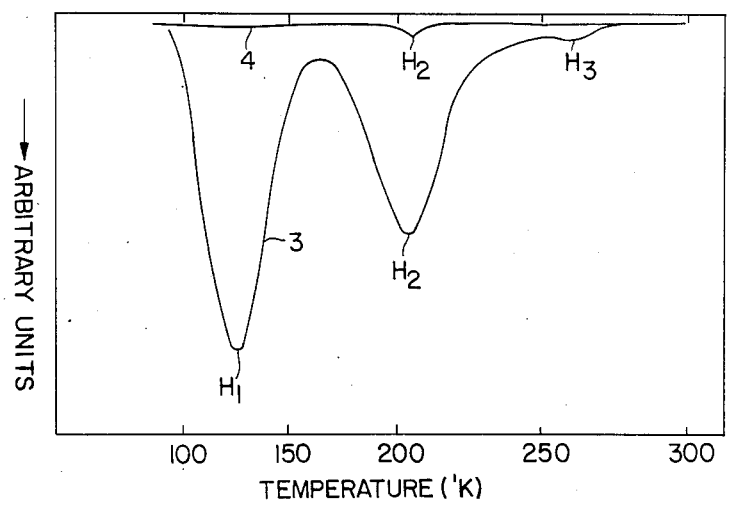

FIG. 2 shows the defect level density spectra of second samples produced under the same conditions as the first samples, as obtained by DLTS method at a rate window of 640/sec. On curve 3 for the case of no hydrogenation, the densities at the levels $H_1$ and $H_2$ were $3.6 \times 10^{13}/cm^3$ and $1.6 \times 10^{13}/cm^3$, respectively. On the other hand, on curve 4 for the case in which hydrogenation was carried out in the course of production, the level $H_1$ disappeared completely, while the density at the level $H_2$, though remaining slightly, was reduced to 1/30 of its former magnitude. The density at level $H_3$, which was very small to begin with, disappeared completely, after hydrogenation.

From the foregoing, it should be noted that when hydrogen is added (hydrogenation) to the thin film of II-V compound semiconductors as it is being produced, the density of intrinsic deep levels either disappears or is greatly reduced, which pronouncedly improves the characteristics of the semiconductor for use in electronic devices.

SECOND Embodiment

Figure 3:
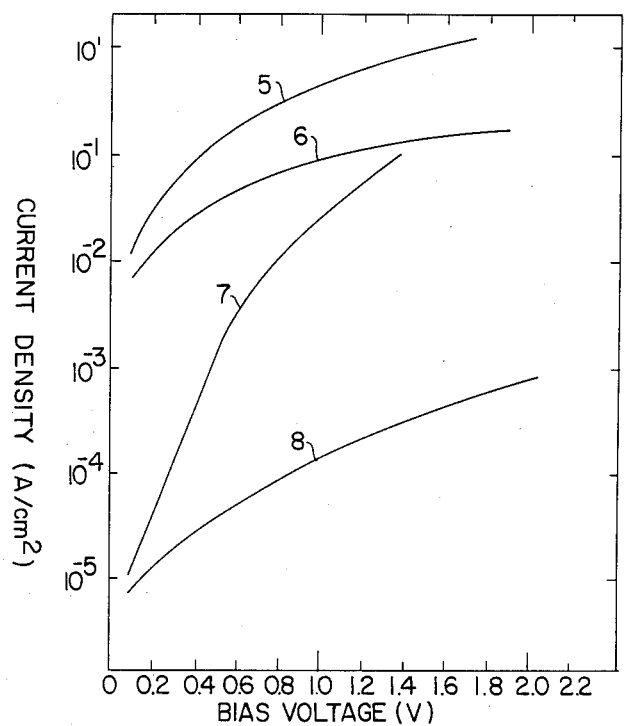
FIG. 3 is a graph showing the current-voltage characteristics of a zinc phosphide/cadmium sulfide heterojunction solar cell in accordance with a second embodiment of this invention.

Zinc phosphide crystal produced beforehand was hydrogenated afterward by the hydrogen plasma method and cadmium sulfide (CdS) was vacuum evaporated on the resulting crystal to obtain zinc phosphide/CdS heterojunction solar cells having the current-voltage characteristics shown in FIG. 3. In the figure, the curves 5 and 6 show the forward and reverse characteristics respectively in the case of no hydrogenation, while the curves 7 and 8 show the corresponding characteristics when hydrogenation was carried out accoring to this invention. From a comparison of curve 8 with curve 6, it is noted that the addition of hydrogen results in a reduction in leakage current in the reverse direction of the order of 10.

Figure 4:
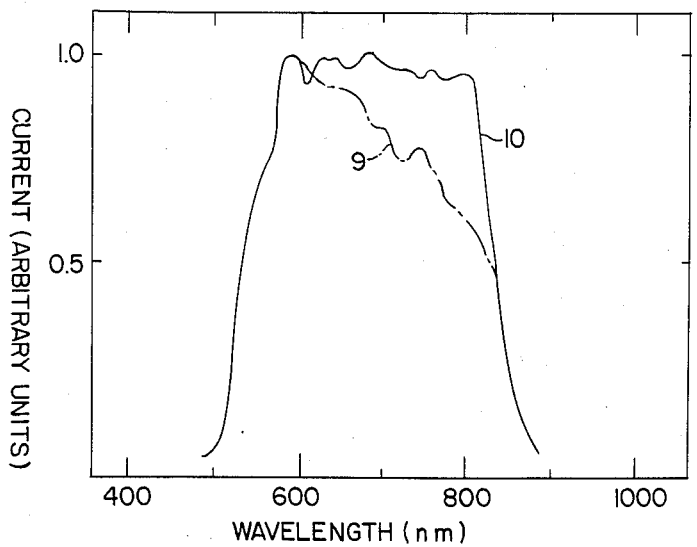
FIG. 4 is a graph showing the spectral response for the solar cell in accordance with the second embodiment of this invention.

The spectral response for these solar cells is shown in FIG. 4, in which curve 9 is for the case of no hydrogenation and curve 10 for the case where hydrogenation was carried out. It is noted that the response at the longer-wavelength region side is greatly improved in the case of curve 10. The improvements that can be seen from FIGS. 3 and 4 can be presumed to result from the disappearance or significant reduction in the density of the hole trap levels $H_1$, $H_2$, $H_3$ described above.

THIRD Embodiment

Zinc phosphide crystal produced beforehand was hydrogenated afterward by the hydrogen plasma method and indium-tin oxide (ITO) was vacuum evaporated on the resulting crystal to obtain ITO/ZnP heterojunction solar cells.

Generally speaking, the surface of zinc phosphide crystal has a layer largely deficient in P atoms extending to a depth of about 100 Å. Therefore, when zinc phosphide is to be used in an electronic device, its current-voltage characteristics can be considerably improved by removing the surface thereof to a depth of approximately 100 Å by sputter etching, etc. In this case, when a process for hydrogenating the zinc phosphide is carried out in addition to the sputter etching process, it is possible to realize at least a 30% improvement in power conversion efficiency over that in the case that only sputter etching is conducted, and also to realize an increase in open-circuit voltage.

Figure 5:
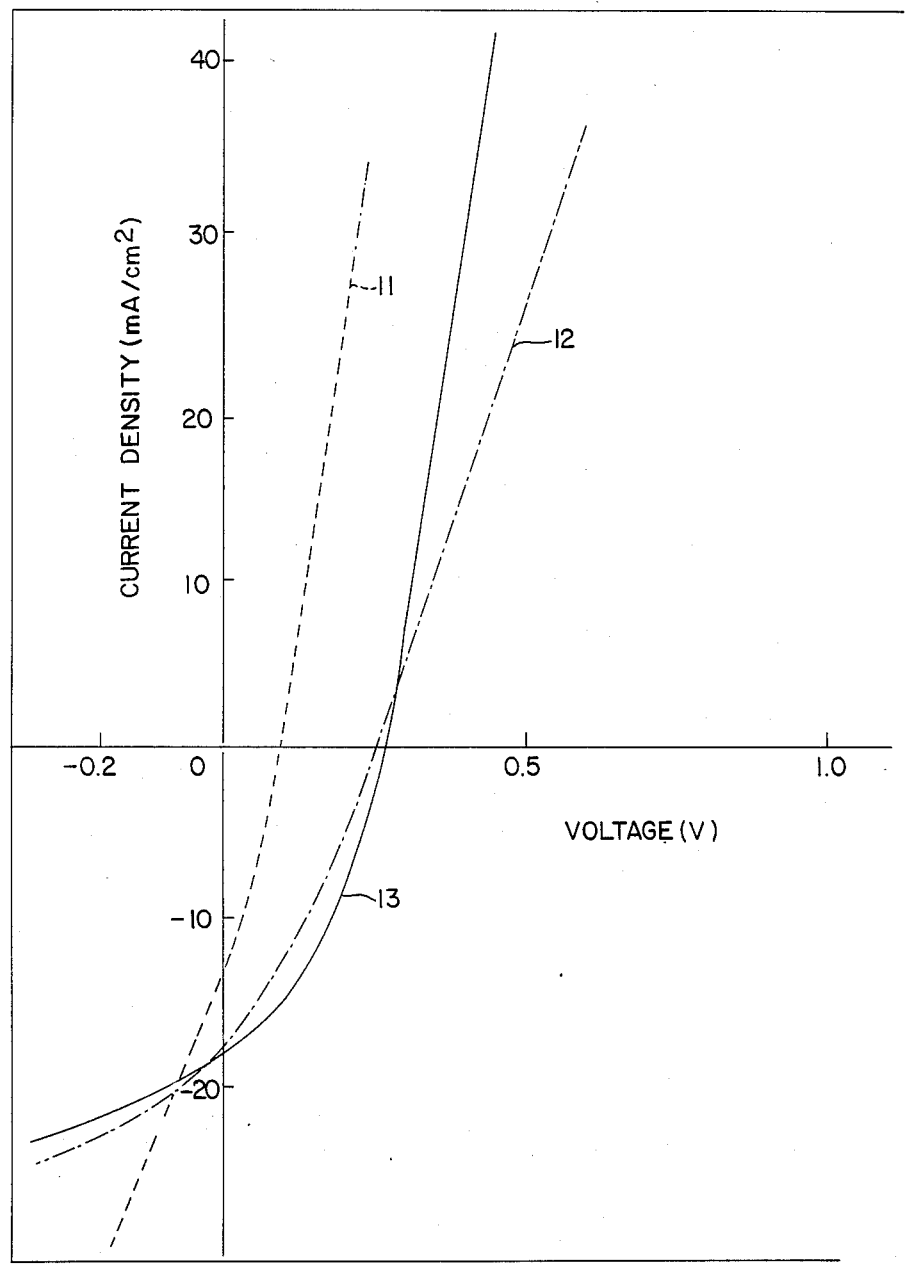
FIG. 5 is a graph showing the current-voltage characteristics under air mass (AM) 1 illumination of a zinc phosphide/indium-tin oxide heterojunction solar cell in accordance with a third embodiment of this invention.

FIG. 5 illustrates the current-voltage characteristics of the solar cell according to the third embodiment under simulated AM 1 illumination (with the sun at zenith). The curve 11 in this figure represents the case where neither sputter etching nor hydrogenation was carried out, the curve 12 the case where only sputter etching was carried out, and the curve 13 the case where hydrogenation was carried out by the hydrogen plasma method after sputter etching had been conducted. As is noted from curve 13 corresponding to the method of the present invention, there is obtained a huge improvement over the case represented by curve 11 where neither process is conducted and a major improvement over the case represented by curve 12 where only sputter etching is carried out.

FOURTH Embodiment

Figure 6:
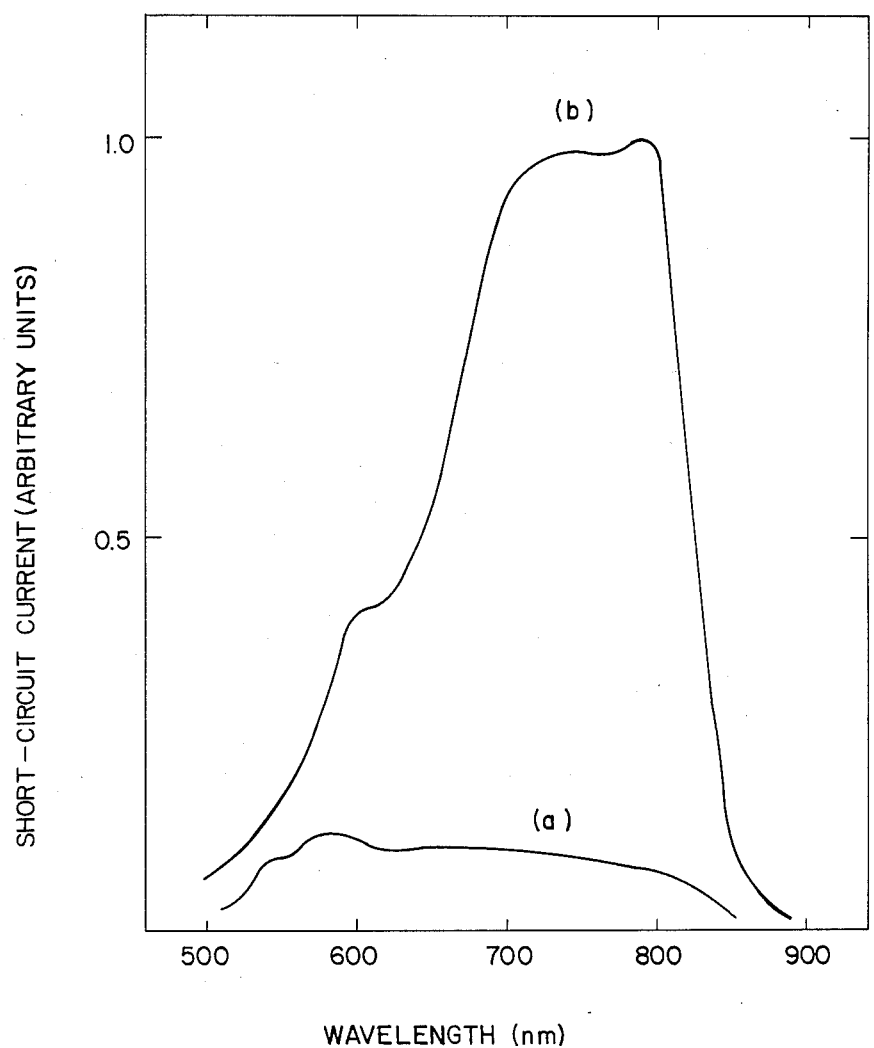
FIG. 6 is a graph showing the spectral response for a cadmium sulfide/zinc phosphide thin film heterojunction in accordance with this invention in contrast to that of a conventional thin film of the same type.

Thin films of zinc phosphide were grown by chemical vapor deposition (CVD) with and without hydrogenation and cadmium sulfide was deposited thereon by vacuum evaporation to obtain solar cells. In FIG. 6, curve (a) represents the spectral response for the solar cell made with non-hydrogenated (as-grown) zinc phosphide and curve (b) the spectral response of the solar cell made with hydrogenated zinc phosphide. Curve (b) shows the good band-pass behavior (window effect) of the heterojunction formed by the CdS window on a $Zn_3P_2$ thin film absorber between 500 nm and 850 nm, corresponding to the approximate bandgaps of the respective semiconductors. In the hydrogenated sample [curve (b)] the signal itself is significantly improved over that of the non-hydrogenated sample [curve (a)], where the response is very low.

FIFTH Embodiment

Figure 7:
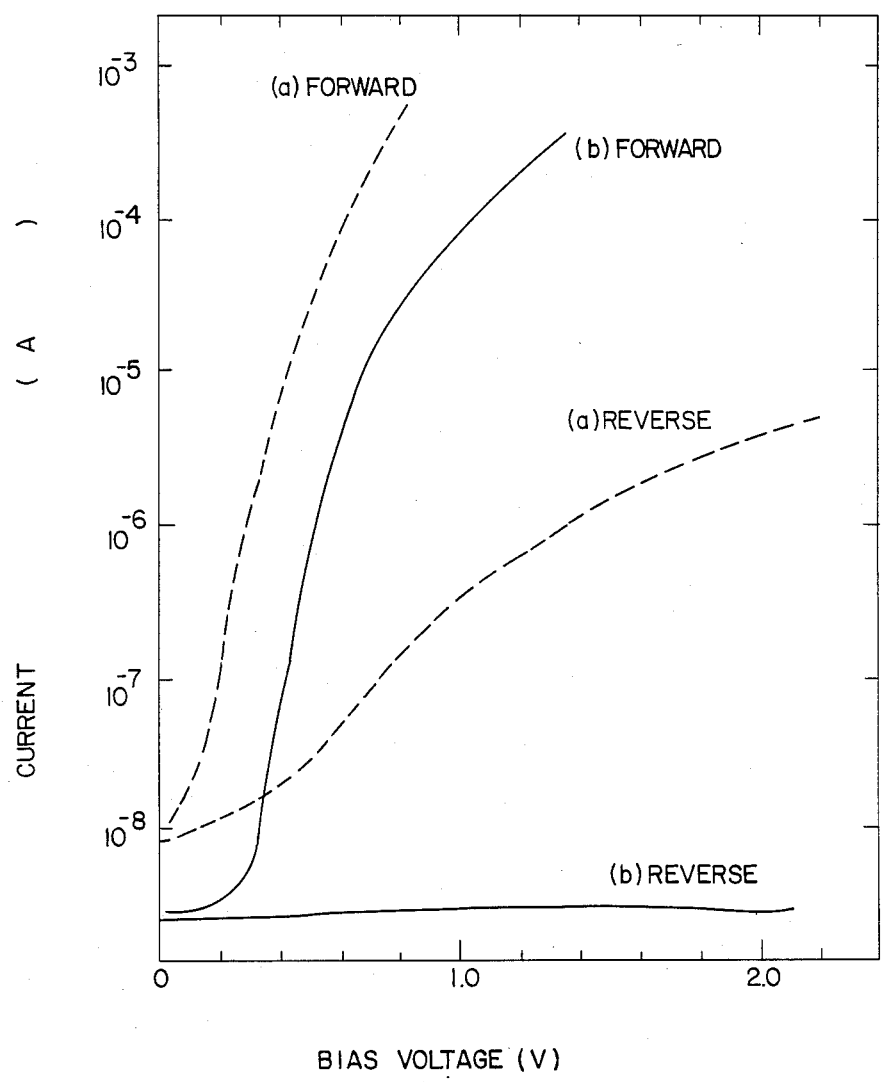
FIG. 7 is a graph showing the current-voltage characteristics of a thin-film zinc phosphide/magnesium Schottky diode in accordance with this invention in contrast to that of a conventional diode of the same type.

Thin films of zinc phosphide were grown by CVD with and without hydrogenation and magnesium was deposited thereon by vacuum evaporation to obtain Schottky diodes with a Mg area measuring 1 mm in diameter. In FIG. 7, curves (a) (dashed line) show the current-voltage characteristics, both forward and reverse characteristics, for a diode made with non-hydrogenated zinc phosphide and curves (b) (solid line) show the current-voltage characteristics, both forward and reverse, for a diode made with hydrogenated zinc phosphide. It is noted that the non-hydrogenated sample [curve (a)] exhibits a large leakage current, resulting in poor rectification. On the contrary, the hydrogenated sample [curve (b)] exhibits a significant improvement in the rectification. In the hydrogenated sample the reverse current is greatly reduced by a factor over of the order of $10^3$, while in the forward current the diffusion potential is improved, providing much better rectification.

Although the earth has abundant deposits of the constituent elements of zinc phosphide and other II-V compound semiconductors, because of their defect structure these semiconductors have been thought to be impossible to apply practically to electronic devices.

Now, however, thanks to the method of production according to the present invention, it has become possible to upgrade these semiconductors into materials that can be used for the production of electronic devices. The industrial usefulness and effect of the invention can therefore be expected to be very large.

Finally, it should be noted that although the above description was made taking zinc phosphide as an example of the II-V compound semiconductors, the present invention is also applicable to the other compounds of the same Group such as cadmium arsenide and the like.

I claim:

1. A method of producing II-V compound semiconductor crystals or thin films comprising adding atomic hydrogen or a halogen in atomic form to a II-V compound semiconductor, filling the atom vacancies therein with said atomic hydrogen or said halogen in atomic form and reducing the intrinsic defect level density of said II-V compound semiconductor.

2. A method according to claim 1 wherein at least one member selected from the group consisting of atomic hydrogen and the halogens in atomic form is added to the II-V compound semiconductor crystals or thin films during the production thereof.

3. A method according to claim 1 wherein at least one member selected from the group consisting of atomic hydrogen and the halogens in atomic form is added to the II-V compound semiconductor crystals or thin films after the production thereof.

4. A method according to claim 1 wherein the addition of atomic hydrogen or a halogen in atomic form is carried out by injection and diffusion.

5. A method according to claim 1 wherein at least one member selected from the group consisting of atomic hydrogen and the halogens in atomic form is injected into and diffused through the II-V compound semiconductor crystals or thin films during the production thereof by the low-pressure vapor-phase method (physical and chemical vapor deposition), the normal-pressure vapor-phase method, the laser chemical vapor deposition method (CVD), the photo-CVD method, the metal organic chemical vapor deposition method (MOCVD), the radical beam method, the plasma CVD method, the glow discharge method, the sputtering method, the ion beam method, the ion plating method, the ionized cluster beam method, the ion deposition method, the molecular beam epitaxy method, the metal organic molecular beam epitaxy (MOMBE) method, the electron cyclotron resonance CVD method, the atomic layer epitaxy method, or the plasma-assisted epitaxy method.

6. A method according to claim 1 wherein at least one member selected from the group consisting of atomic hydrogen and the halogens in atomic form is injected into and diffused through the II-V compound semiconductor crystals or thin films by the plasma method, the ion beam method, the diffusion method, the ion injection method or the ion plating method after production thereof.

* * * * *

UNITED STATES PATENT AND TRADEMARK OFFICE
CERTIFICATE OF CORRECTION

PATENT NO. : 4,629,514
DATED : December 16, 1986
INVENTOR(S) : Toshikazu Suda

It is certified that error appears in the above-identified patent and that said Letters Patent is hereby corrected as shown below:

Column 3, line 9, change "H" to --$H_3$--;

Column 3, line 48, change "10" to --$10^3$--;

Column 3, line 63, change "ZnP" to --$Zn_3P_2$--.

Signed and Sealed this

Sixteenth Day of April, 1991

Attest:

HARRY F. MANBECK, JR.

Attesting Officer

Commissioner of Patents and Trademarks